(12) United States Patent
McCulloch et al.

(10) Patent No.: US 8,562,870 B2
(45) Date of Patent: *Oct. 22, 2013

(54) POLYMER DOPANTS

(75) Inventors: Iain McCulloch, Southampton (GB);
Martin Heeney, Southampton (GB);
Mark Giles, Southampton (GB); Maxim Shkunov, Southampton (GB); Steven Tierney, Southampton (GB); Clare Bailey, Southampton (GB)

(73) Assignee: Merck Patent GmbH, Darmstadt (DE)

( * ) Notice: Subject to any disclaimer, the term of this patent is extended or adjusted under 35 U.S.C. 154(b) by 1949 days.

This patent is subject to a terminal disclaimer.

(21) Appl. No.: 11/503,933

(22) Filed: Aug. 15, 2006

(65) Prior Publication Data

US 2006/0273288 A1     Dec. 7, 2006

Related U.S. Application Data

(63) Continuation of application No. 10/763,382, filed on Jan. 26, 2004, now Pat. No. 7,186,358.

(30) Foreign Application Priority Data

Jan. 25, 2003  (EP) .................................. 03001678

(51) Int. Cl.
*H01B 1/06*  (2006.01)
(52) U.S. Cl.
USPC ............................. 252/510; 25/500; 257/40

(58) Field of Classification Search
USPC ..................................... 252/500, 510; 257/40
See application file for complete search history.

(56) References Cited

U.S. PATENT DOCUMENTS

| 4,225,692 | A | * | 9/1980 | Turner | 526/244 |
| 4,226,967 | A | * | 10/1980 | Tazuke et al. | 528/74 |
| 4,594,180 | A | | 6/1986 | Kobayashi et al. | |
| 5,026,774 | A | * | 6/1991 | Day et al. | 525/56 |
| 5,185,102 | A | | 2/1993 | Harelstad et al. | |
| 5,378,402 | A | * | 1/1995 | Cross et al. | 252/500 |
| 6,835,803 | B1 | | 12/2004 | Ho et al. | |

FOREIGN PATENT DOCUMENTS

| EP | 0 402 038 | | 12/1990 |
| JP | 08-036200 | * | 2/1996 |
| JP | 8-36200 | | 2/1996 |
| JP | H10-036687 | * | 2/1998 |
| WO | WO 00/60612 | | 10/2000 |

* cited by examiner

*Primary Examiner* — Mark Kopec
*Assistant Examiner* — Jaison Thomas
(74) *Attorney, Agent, or Firm* — Millen, White, Zelano & Branigan, P.C.

(57) ABSTRACT

A polymer dopant for electrially conducting, photoconducting and semiconducting components and devices and novel polymers comprising electron accepting groups that are suitable as polymer dopants.

17 Claims, No Drawings

POLYMER DOPANTS

This application is a continuation of U.S. application Ser. No. 10/763,382 filed Jan. 26, 2004 now U.S. Pat. No. 7,186,358 claiming the benefit of European application number 03001678.6 filed Jan. 25, 2003.

FIELD OF INVENTION

The invention relates to the use of polymer dopants for electrically conducting, photoconducting and semiconducting components and devices and to novel polymers comprising electron accepting groups that are suitable as polymer dopants.

BACKGROUND AND PRIOR ART

In the field of organic semiconductors, a major effort exists to improve the charge carrier mobility of the organic semiconductor material to levels approaching amorphous silicon (0.1 cm$^2$/Vs) [see H. E. Katz, Z. Bao and S. L. Gilat, *Acc. Chem. Res.*, 2001, 34, 5, 359]. This would enable organic field effect transistors (OFET) to operate at frequencies that make them attractive for a host of applications including radio frequency identification (RFID) tags and thin film transistors (TFT) in flat panel displays.

One organic semiconducting polymer candidate is regio-regular polyalkyl thiophene (PAT) [see Z. Bao et al., *Appl. Pys. Lett.* 1997, 78, 2184]. This polymer can be fabricated via solution deposition, to form thin films with a highly ordered morphology, which facilitates charge transfer via a hopping mechanism.

Very promising mobilities of up to 0.1 cm$^2$/Vs have been demonstrated for this polymer. See H. Sirringhaus, P. J. Brown, R. H. Friend, M. M. Nielsen, K. Bechgaard, B. M. W. Langeveld-Voss, A. J. H. Spiering, R. A. J. Janssen, E. W. Meijer, P. Herwig & D. M. de Leeuw "Two-dimensional charge transport in self-organized, high-mobility conjugated polymers" Nature 401 685 (1999).

In order to increase this value further, and maximise the carrier mobility, one strategy is to increase the number of charge carriers, by doping the polymer. As described by A. R. Brown, D. M. De Leeuw, E. E. Havinga, and A. Pomp in "A Universal Relation between conductivity and field effect mobility in doped amorphous organic semiconductors", Synth. Met. 68, 65-70 (1994), increased dopant concentration increases the density of states, and hence increases the probability of hopping transport. Thus, equally, an increase in charge mobility is expected with increase in dopant concentration.

The above reference also demonstrates that the bulk conductivity is also proportional to the number of mobile charge carriers per unit volume. A practical consequence of this however, is that the ON/OFF ratio of the OFET drops with increasing doping concentration, ultimately to a value of unity.

To circumvent this problem, new transistor structures and modes have been proposed [see Lloyd, G. C. R.; Sedghi, N.; Raja, M.; Di Lucrezia, R.; Higgins, S.; Eccleston, W. "Increasing the carrier mobility in P3HT by doping for use in schottky barrier TFTs", Materials Research Society Symposium Proceedings (2002), 708 (Organic Optoelectronic Materials, Processing and Devices), 429-434], which utilise Schottky barriers between the electrodes and the semiconductor. By employing this design, the polymer can be fully doped, which can also lead to higher mobilities, without suffering the problem of low ON/OFF ratios.

A simple way to dope the semiconductor is to add an electron poor organic dopant like for example dichlorodicyano-benzoquinone (DDQ) (1) to the polymer formulation before fabrication, which leads to its incorporation in the polymer matrix. DDQ is known in prior art as an oxidative dopant small molecule containing effective electron withdrawing functionality such as quinoline and cyano groups [see C. P. Jarrett, R. H. Friend, A. R. Brown, D. M. DeLeeuw, in "Field effect measurements in doped conjugated polymer films: Assessment of charge carrier mobilities", J. Appl. Phys, 77(12) 6289 (1995).].

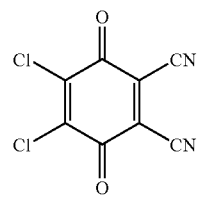

1

A major problem with these small molecule dopants, is that they can be mobile, diffusing through the polymer film or subliming from the surface. Both these efffects have detrimental consequences for the performance of a working OFET device, potentially leading to time dependant mobility, and high off currents.

It is an aim of the present invention to provide new methods of doping organic semiconductor materials to induce or increase their charge carrier mobility and electrical conductivity. Another aim of the invention is to provide new materials that are suitable as doping agents.

Another aim of the invention is to provide advantageous uses for the new doping materials, in particular for semiconductor, electrical conductor or photoconductor components or materials, and in optical, electrooptical or electronic devices.

Other aims of the invention are immediately evident to those skilled in the art from the following description.

The inventors have found that these aims can be achieved by using polymeric dopants, in particular polymers comprising an electron accepting group in the side chain, as doping agent in an organic semiconductor or charge transport material. The inventors have further found that polymers comprising a side chain based on quinone are especially useful as polymer dopants.

SUMMARY OF THE INVENTION

The present invention relates to a semiconductor or charge transport material, component or device, characterized in that it comprises a polymer comprising at least one electron accepting group that is bound to the polymer, preferably covalently, as doping agent to induce or enhance charge carrier mobility or electrical conductivity in the semiconductor material.

The invention further relates to a semiconductor or charge transport material, component or device, wherein the electron accepting group is covalently incorporated in a polymer chain, preferably the main chain, or covalently bound, optionally via a spacer group, as a side group or part of a side chain, to a polymer backbone.

The invention further relates to a semiconductor or charge transport material, component or device, wherein the polymer dopant is selected of formula I

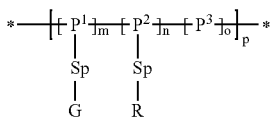

I wherein
P$^{1-3}$ independently of each other denote a group forming a polymer backbone,
Sp is, each independently, a spacer group or a single bond,
G is an electron accepting group,
R is an organic group imparting a low surface energy to the polymer,
m, n, o are independently of each other 0 or 1, wherein in each recurring unit ([P$^1$(Sp-G)]$_m$-[P$^2$(R)]$_n$-[P$^3$]$_o$)$_p$ m+n+o>0, and in at least one of these recurring units m is 1,
p is an integer from 1 to 500,000.

The invention further relates to a novel polymer comprising at least one electron accepting group which is covalently bound, optionally via a spacer group, to a polymer backbone, wherein
   the electron accepting group is selected from optionally substituted quinone or cyanoquinone, or an aromatic or conjugated non aromatic group that is mono- or polysubstituted by cyano, halo, haloalkyl, nitro or ester groups, and/or
   the polymer comprises at least one organic group imparting a low surface energy to the polymer which is covalently bound, optionally via a spacer group, to the polymer backbone.

The invention further relates to a novel polymer of formula I, wherein
   the electron accepting group G is selected from optionally substituted quinone or cyanoquinone, or an aromatic or conjugated non aromatic group that is mono- or polysubstituted by cyano, halo, haloalkyl, nitro or ester groups, and/or
   in at least one recurring unit n is 1 and/or in at least one recurring unit o is 1.

The invention further relates to the use of a polymer, monomer or polymerizable material as described above and below as doping agent in a semiconductor, electrical conductor or photoconductor component or material, in optical, electrooptical or electronic devices, field effect transistors (FET) as components of integrated circuitry, of thin film transistors (TFT) for flat panel display applications, or of radio frequency identification (RFID) tags, organic diodes, semiconducting components for organic light emitting diode (OLED) applications, including the charge transport and electroluminescent component in electroluminescent displays or backlights of flat panel displays or liquid crystal displays, in photovoltaic, photoconductor or sensor devices, as electrode material in batteries, and for electrophotographic applications like electrophotographic recording.

The invention further relates to the use of a polymer as doping agent as described above, wherein the polymer dopant forms a molecularly dissolved or dispersed polymer blend in a semiconductor matrix, or a thin film layer that is in direct contact with a semiconductor material.

The invention further relates to an organic material with improved charge carrier mobility, characterized in that it comprises one or more organic semiconductor components and one or more polymer dopant components, wherein at least one polymer dopant component is a polymer as described above and below, preferably wherein the semiconductor component(s) and the polymer dopant component(s) form a mixture, solution, dispersion or polymer blend, optionally with further components.

The invention further relates to a semiconductor, electrical conductor, photoconductor, electrooptical or electronic material, component or device, characterized in that it comprises an organic material as defined above.

The invention further relates to a semiconductor, electrical conductor, photoconductor, electrooptical or electronic material, component or device, comprising at least one layer of an organic semiconductor material, characterized in that it further comprises at least one layer of a polymer dopant as described above and below that is in direct contact with said semiconductor layer.

The invention further relates to a semiconductor, electrical conductor, photoconductor, electrooptical or electronic device as described above, characterized in that it is a field effect transistor (FET), a charge transport or electroluminescent component in an organic light emitting diode (OLED), a photovoltaic, photoconductor or a sensor device, a battery electrode or part thereof, an electrophotographic or electrophotographic recording device, a charge injection layer, a Schottky diode, a planarising layer, an antistatic film or a conducting substrate or pattern.

The invention further relates to an integrated circuit (IC), thin film transistor (TFT), radio frequency identification (RFID) tag, organic light emitting diode (OLED), electroluminescent display, backlight, flat panel display, liquid crystal display, battery or sensor, characterized in that it comprises a component or device as described above and below.

The invention further relates to a security marking or device, characterized in that it comprises a FET or an RFID tag as described above and below.

DETAILED DESCRIPTION OF THE INVENTION

The polymers according to the present invention are especially suitable as dopant for a semiconductor material in a semiconducting component or device, like for example FETs.

As the charge transport for example in a FET device occurs mainly at the semiconductor/insulator interface, it is sufficient to only surface dope the semiconductor polymer and still achieve high mobility. This can be achieved by applying a very thin layer of dopant on the semiconductor surface. A further advantage of this approach is that the bulk conductivity remains constant.

However, if low molar mass species are used as dopants, a problem associated with this approach is that the dopant can diffuse throughout the transistor structure, or sublime from the surface, both reducing the surface effect, and potentially disrupting morphology and hence mobility. This problem is circumvented according to the present invention by anchoring the dopant as a polymer component, thus eliminating diffusion or sublimation. This is accomplished by incorporating a dopant, preferably an oxidising dopant, as a side chain on an immobile polymer. The polymer can then be incorporated in the OFET device as either a blend in the semiconductor layer, or as a discrete thin between semiconductor and insulator The polymer according to the present invention containing the dopant group is preferably situated for example in a transistor structure between the semiconductor and the insulator.

The polymer dopant is preferably chosen in such a way that it is compatible with solution processing of the device, either soluble in the same solvent as the semiconductor if a blend is desired, or has orthogonal solubility to the semiconductor if a discrete thin film is desired.

In a polymer of the present invention the recurring units $([P^1(Sp-G)]_m\text{-}[P^2(R)]_n\text{-}[P^3]_o)_p$ in case of multiple occurrence can be selected of formula I independently of each other, so that the polymer can comprise identical or different recurring units. The polymers thus include homopolymers and regular or random copolymers like for example statistically random copolymers, for example with a monomer sequence such as $-P^1\text{-}P^2\text{-}P^1\text{-}P^1\text{-}P^3\text{-}P^2\text{-}P^1\text{-}P^3$-, alternating copolymers, for example with a monomer sequence such as $-P^1\text{-}P^2\text{-}P^1\text{-}P^2$- or $P^1\text{-}P^2\text{-}P^3\text{-}P^1\text{-}P^2\text{-}P^3$-, or block copolymers, for example with a monomer sequence such as $-P^1\text{-}P^1\text{-}P^1\text{-}P^2\text{-}P^2\text{-}P^2\text{-}P^3\text{-}P^3\text{-}P^3$-, (with the groups -Sp-G and -R not being shown for sake of simplicity), as well as blends thereof with other polymers.

Further preferred are polymers comprising one or more recurring units $([P^1(Sp-G)]_m\text{-}[P^2(R)]_n\text{-}[P^3]_o)_p$, wherein m=1 and n=o=0, very preferably consisting exclusively of such recurring units.

Further preferred are polymers comprising one or more recurring units $([P^1(Sp-G)]_m\text{-}[P^2(R)]_n\text{-}[P^3]_o)_p$, wherein m=n=1 and o=0, very preferably consisting exclusively of such recurring units.

Further preferred are polymers comprising one or more recurring units $([P^1(Sp-G)]_m\text{-}[P^2(R)]_n\text{-}[P^3]_o)_p$, wherein m=o=1 and n=0, very preferably consisting exclusively of such recurring units.

Further preferred are polymers comprising one or more recurring units $([P_1(Sp-G)]_m\text{-}[P^2(R)]_n\text{-}[P^3]_o)_p$, wherein m=n=o=1, very preferably consisting exclusively of such recurring units.

For the polymer backbone, in principle all polymers can be used that are known to the skilled in the art. Very preferred are polymer chains that have a certain flexibility and solubility. These may be linear, branched or cyclic polymer chains.

Preferred backbones are selected from the group comprising maleic anhydride (co-)polymers, maleimide (co-)polymers, polyacrylate, polymethacrylate, poly-α-haloacrylate, poly-α-cyanoacrylate, polyacrylamide, polyacrylonitrile, polymethylene malonate, polymethylene maleimide, polyester, polyamide, polyimide, polyphosphazene, polyurethane, polysiloxane, polyepoxide, polyvinylalcohol, polyvinylether, polyvinlpyrrolidone, polyethyleneimine, polyalkylene, polycarbonate, polystyrene and copolymers thereof, or blends thereof with other polymers.

The groups $P^{1-3}$ forming a polymer backbone are preferably selected from groups which can react, for example via chain-growth reaction like anionic, cationic or radicalic polymerization, or via step-growth reaction, like polyaddition or polycondensation, to form a polymer backbone of the preferred group mentioned above. The groups $P^{1-3}$ can be identical or different.

In case of side-chain polymers of formula I, it is possible to polymerize monomers and/or oligomers which already carry the group Sp-G and/or the group R, for example by a chain-growth reaction, like free-radical or ionic polymerization, or a step-growth reaction, like polycondensation or polyaddition, including ring-opening polymerization and methathesis polymerization.

Thus, the invention further relates to a monomer of formula I1

$P^{11}$-Sp-G    I1 wherein Sp and G are as defined in formula I, and $P^{11}$ is a polymerizable group which can react into a polymer backbone as formed by group $P^1$.

The invention further relates to a polymerizable material comprising one or more monomers of formula I1 and optionally comprising one or more monomers selected of formula I2 and/or I3

$P^{22}$-Sp-R    I2

$P^{33}$    I3 wherein R and Sp are is as defined in formula I, $P^{22}$ is a polymerizable group which can react into a polymer backbone as formed by group $P^2$, and $P^{33}$ is a monomer which upon polymerisation gives a polymer backbone as formed by group $P^3$.

The invention further relates to a polymer obtained by polymerization of a monomer of formula I1 or of a polymerizable material comprising one or more monomers of formula I1 and optionally comprising one or more momomers of formula I2.

Alternatively it is possible to attach the group Sp-G or R to an existing polymer chain, which is a backbone formed by the group $P^1$ and optionally $P^2$ or a backbone of the preferred group mentioned above, by a so-called polymer-analoguous or grafting reaction.

In case of a polymer formed by a polymer-analoguous or grafting reaction, the group $P^3$ can also denote the unreacted form of group $P^1$ or $P^2$ resulting from an incomplete grafting reaction. For example, in case a polymer (1b) as shown below is prepared by grafting a group G to a maleic anhydride polymer backbone (1a), some of the maleic anhydride units may remain unreacted, so that a copolymer comprising a mixture of substituted maleimide units (corresponding to $P^1$) and unsubstituted maleic anhydride units (corresponding to $P^3$) is obtained.

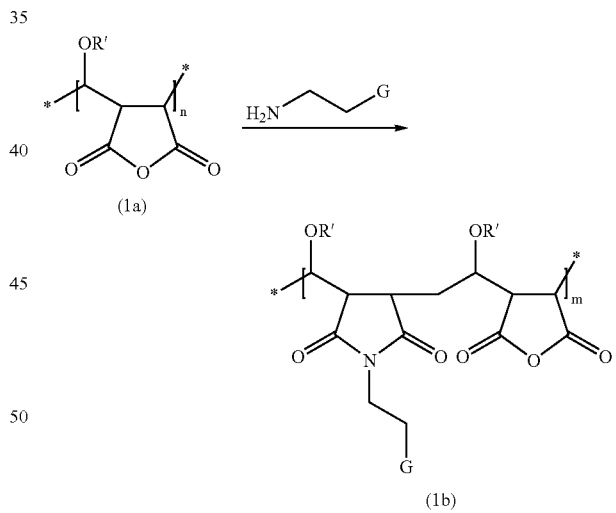

wherein R' is alkyl or alkoxy with 1 to 20 C atoms.

The polymerizable groups $P^{11}$ and $P^{22}$ are preferably selected from $CH_2\text{=}CW^1\text{---}COO\text{---}$,

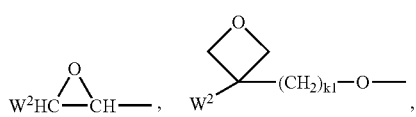

$CH_2\text{=}CW^2\text{---}(O)_{k1}\text{---}$,   $CH_3\text{---}CH\text{=}CH\text{---}O\text{---}$,
$(CH_2\text{=}CH)_2$   $CH\text{---}OCO\text{---}$,   $(CH_2\text{=}CH)_2CH\text{---}O\text{---}$, $(CH_2=CH—CH_2)_2CH—OCO—$, $(CH_2=CH—CH_2)_2N—$, $HO—CW^2W^3—$, $HS—CW^2W^3—$, $HW^2N—$, $HO—CW^2W^3—NH—$, $CH_2=CW^1—CO—NH—$, $CH_2=CH—(COO)_{k1}$-Phe-$(O)_{k2}—$, Phe-CH=CH—, HOOC—, OCN—, and $W^4W^5W^6Si—$, with $W^1$ being H, Cl, CN, phenyl or alkyl with 1 to 5 C-atoms, in particular H, Cl or $CH_3$, $W^2$ and $W^3$ being independently of each other H or alkyl with 1 to 5 C-atoms, in particular methyl, ethyl or n-propyl, $W^4$, $W^5$ and $W^6$ being independently of each other Cl, oxaalkyl or oxacarbonylalkyl with 1 to 5 C-atoms, Phe being 1,4-phenylene and $k_1$ and $k_2$ being independently of each other 0 or 1.

Especially preferred polymerizable groups are $CH_2=CH—COO—$, $CH_2=C(CH_3)—COO—$, $CH_2=CH—$, $CH_2=CH—O—$, $(CH_2=CH)_2CH—OCO—$, $(CH_2=CH)_2CH—O—$, and

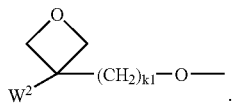

Very preferred are acrylate and methacrylate groups.

In case of polymerizable mixtures and copolymers comprising monomers of formula I1 and I2, the polymerizable groups $P^{11}$ and $P^{22}$ can be identical or different. Especially preferred are mixtures and copolymers wherein the polymerizable groups $P^{11}$ and $P^{22}$ are identical.

$P^{33}$ is preferably a monomer capable of reacting into a polymer backbone as formed by group $P^3$, or capable of reacting into a copolymer with $P^{11}$ and/or $P^{22}$, thus extending the polymer chain. Examples of suitable and preferred monomers $P^{33}$ include vinyl ethers, styrenes, alkyl acrylates and alkylmethacrylates, vinylpyrrolidones, vinyl acetates and maleic acid derivatives. Further preferred are monomers $P^{33}$ selected of formula $P^{33'}$—R", wherein $P^{33'}$ has one of the preferred meanings of $P^{11}$ and $P^{22}$ as given above and R"H or alkyl with 1 to 20 C atoms.

In the polymers according to the present invention or in the polymer of formula I, the number of recurring units or the group p is preferably at least 5, very preferably at least 10, however, oligomers containing 3 to 15 monomer units are also possible. Especially preferred are polymers, in particular those of formula I, wherein the number of recurring units or p is from 10 to 500,000.

Further preferred are polymers of formula I, wherein in at least one recurring unit n is 1 and R is as defined above and below, preferably selected from $C_1$-$C_{20}$-fluoroalkyl, $C_1$-$C_{15}$-perfluoroalkyl, —$(Si(R^0R^{00})—O)_r$—$R^{000}$ and $(CH_2CH_2O)_s$, wherein $R^0$, $R^{00}$ and $R^{000}$ are independently of each other H or alkyl with 1 to 12 C-atoms, r is an integer from 1 to 15 and s is an integer from 1 to 6.

For the spacer group or the group Sp in formula I, in principle all groups can be used that are known for this purpose to the skilled in the art.

Preferred spacer groups are selected of formula II $X^1$-$Sp^1$-$X^2$      II wherein $Sp^1$ is alkylene with 1 to 20 C atoms which may be unsubstituted, mono- or poly-substituted by F, Cl, Br, I, CN or OH, it being also possible for one or more non-adjacent $CH_2$ groups to be replaced, in each case independently from another, by —O—, —S—, —NH—, —$NR^0$—, —$SiR^0R^{00}$—, —CO—, —COO—, —OCO—, —OCO—O—, —S—CO—, —CO—S—, —CH=CH— or —C≡C— in such a manner that O and/or S atoms are not linked directly to one another, or a single bond, $X^1$ and $X^2$ are independently of each other —O—, —S—, —$NR^0$—, —CO—, —COO—, —OCO—, —O—COO—, —CO—$NR^0$—, —$NR^0$—CO—, —$OCH_2$—, —$CH_2O$—, —$SCH_2$—, —$CH_2S$—, —$CF_2O$—, —$OCF_2$—, —$CF_2S$—, —$SCF_2$—, —$CF_2CH_2$—, —$CH_2CF_2$—, —$CF_2CF_2$—, —CH=N—, —N=CH—, —N=N—, —CH=CH—, —$CR^0$=$CR^{00}$—, —$CY^1$=$CY^2$—, —C≡C—, —CH=CH—COO—, —OCO—CH=CH— or a single bond, $Y^1$ and $Y^2$ are independently of each other H, F, Cl or CN and $R^0$ and $R^{00}$ are independently of each other H or alkyl with 1 to 12 C-atoms.

Typical groups $Sp^1$ are, for example, —$(CH_2)_t$—, —$(CH_2CH_2O)_u$—$CH_2CH_2$—, —$CH_2CH_2$—S—$CH_2CH_2$— or —$CH_2CH_2$—NH—$CH_2CH_2$— or —$(SiR^0R^{00}—O)_t$—, with t being an integer from 2 to 12, u being an integer from 1 to 3 and $R^0$ and $R^{00}$ having the meanings given above.

Preferred groups $Sp^1$ are for example ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene.

$X^1$ and $X^2$ are preferably selected from —O—, —S—, —$NR^0$—, —CO—, —COO—, —OCO—, —O—COO—, —CO—$NR^0$—, —$NR^0$—CO—, and a single bond, in particular from —CO—, —$NR^0$—CO—, —CO—$NR^0$— and a single bond.

Especially preferred spacer groups are selected from the following formulae

| | |
|---|---|
| *-Alkyl-CO—NH— | IIa |
| *-Alkyl-COO— | IIb |
| *-Alkyl-O— | IIc |
| *-Alkyl-NH— | IId |
| *-Alkyl- | IIe |
| *-Alkyl-CH(OH)—$CH_2$—NH— | IIf |
| *-Alkyl-CH(OH)—$CH_2$—O— | IIg | wherein Alkyl denotes an alkyl, fluoroalkyl or oxaalkyl group with 1 to 15 C atoms, and the asterisk denotes the side that is linked to the polymer backbone.

Suitable and preferred electron accepting groups or groups G are selected from optionally substituted quinone or cyanoquinone, and aromatic or conjugated non aromatic groups that are mono- or polysubstituted by cyano, halo, haloalkyl, nitro or ester groups.

Very preferably the electron accepting group is selected of formula III

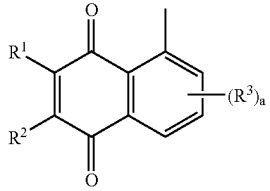

wherein
$R^1$ and $R^2$ are independently of each other H, halogen or CN,
$R^3$ is in each occurrence independently of one another halogen, CN, $NO_2$, $NR^0R^{00}$, or straight chain, branched or cyclic alkyl with 1 to 20 C-atoms, which is unsubstituted, mono- or polysubstituted by F, Cl, Br, I or CN, and wherein one or more non-adjacent $CH_2$ groups are optionally replaced, in each case independently from one another, by —O—, —S—, —NH—, —NR$^0$—, —SiR$^0$R$^{00}$—, —CO—, —COO—, —OCO—, —OCO—O—, —SO$_2$—, —S—CO—, —CO—S—, —CH═CH— or —C≡C— in such a manner that O and/or S atoms are not linked directly to one another,
$R^0$ and $R^{00}$ are as defined in formula II, and
a is 0, 1, 2 or 3.

Especially preferred electron accepting groups are selected from the following formulae

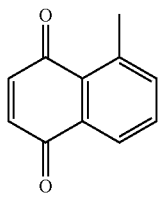

IIIa

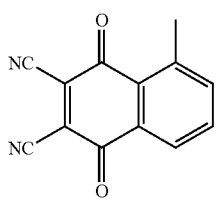

IIIb

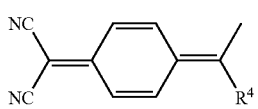

IVa

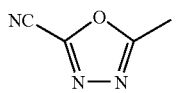

Va

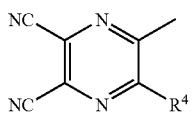

VIa

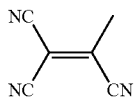

VIIa

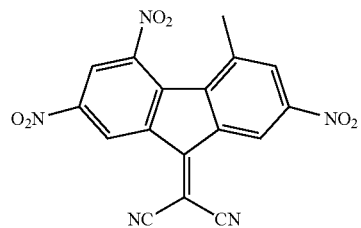

VIIIa

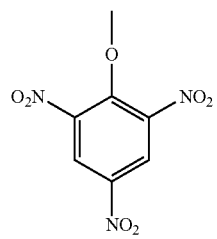

IXa wherein $R^4$ has one of the meanings of $R^3$ given in formula III.

The group R in formula I is an organic moiety that is designed to impart a lower surface energy to the polymer dopant, or reduce the actual surface energy of the polymer to below that of the semiconductor, and thus preferentially partition at the air interface of a polymer dopant-semiconductor blend. Thus, the group R should act as surfactant and is preferably selected from surface active groups.

R is preferably straight chain, branched or cyclic alkyl with 1 to 20 C-atoms, which is unsubstituted, mono- or polysubstituted by F, Cl, Br, I or CN, and wherein one or more non-adjacent $CH_2$ groups are optionally replaced, in each case independently from one another, by —O—, —S—, —NH—, —NR$^0$—, —SiR$^0$R$^{00}$—, —CO—, —COO—, —OCO—, —OCO—O—, —SO$_2$—, —S—CO—, —CO—S—, —CH═CH— or —C≡C— in such a manner that O and/or S atoms are not linked directly to one another.

Very preferably R is selected from $C_1$-$C_{20}$-fluoroalkyl, in particular $C_1$-$C_{15}$-perfluoroalkyl, —(Si(R$^0$R$^{00}$)—O)$_r$—R, and $(CH_2CH_2O)_s$, wherein $R^0$, $R^{00}$ and $R^{000}$ are independently of each other H or alkyl with 1 to 12 C-atoms, r is an integer from 1 to 15 and s is an integer from 1 to 6.

If in the formulae shown above and below one of R and $R^{1-4}$ is an alkyl or alkoxy radical, i.e., where the terminal $CH_2$ group is replaced by —O—, this may be straight-chain or branched. It is preferably straight-chain, has 2 to 8 carbon atoms and accordingly is preferably ethyl, propyl, butyl, pentyl, hexyl, heptyl, octyl, ethoxy, propoxy, butoxy, pentoxy, hexyloxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example.

Oxaalkyl, i.e., where one $CH_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

Fluoroalkyl or fluorinated alkyl or alkoxy is preferably straight chain $(O)C_iF_{2i+1}$, wherein i is an integer from 1 to 20, in particular from 1 to 15, very preferably $(O)CF_3$, $(O)C_2F_5$, $(O)C_3F_7$, $(O)C_4F_9$, $(O)C_5F_{11}$, $(O)C_6F_{13}$, $(O)C_7F_{15}$ or $(O)C_8F_{17}$.

Halogen is preferably F, Br or Cl.

The polymer dopants can be prepared by methods like polymerization reactions or polymer-analoguous reactions which are known per se and are described in the literature (for example in the standard works such as Odian, Principles of Polymerization, McGraw-Hill, New York), to be precise under reaction conditions which are known and suitable for the reactions. Use may also be made here of variants which are known per se, but are not described here in greater detail.

Some preferred methods of preparing the polymer dopants are described below.

An example of a synthetic route via chain-growth reaction to both a non-surfactant type polymer dopant ((a)-(c)) and a surfactant type polymer dopant (d) based on polymethacrylate with a functionalised carboxylic acid (a), isocyanate (b) or epoxy (c, d) side chain is shown in Scheme 1.

Scheme 1:

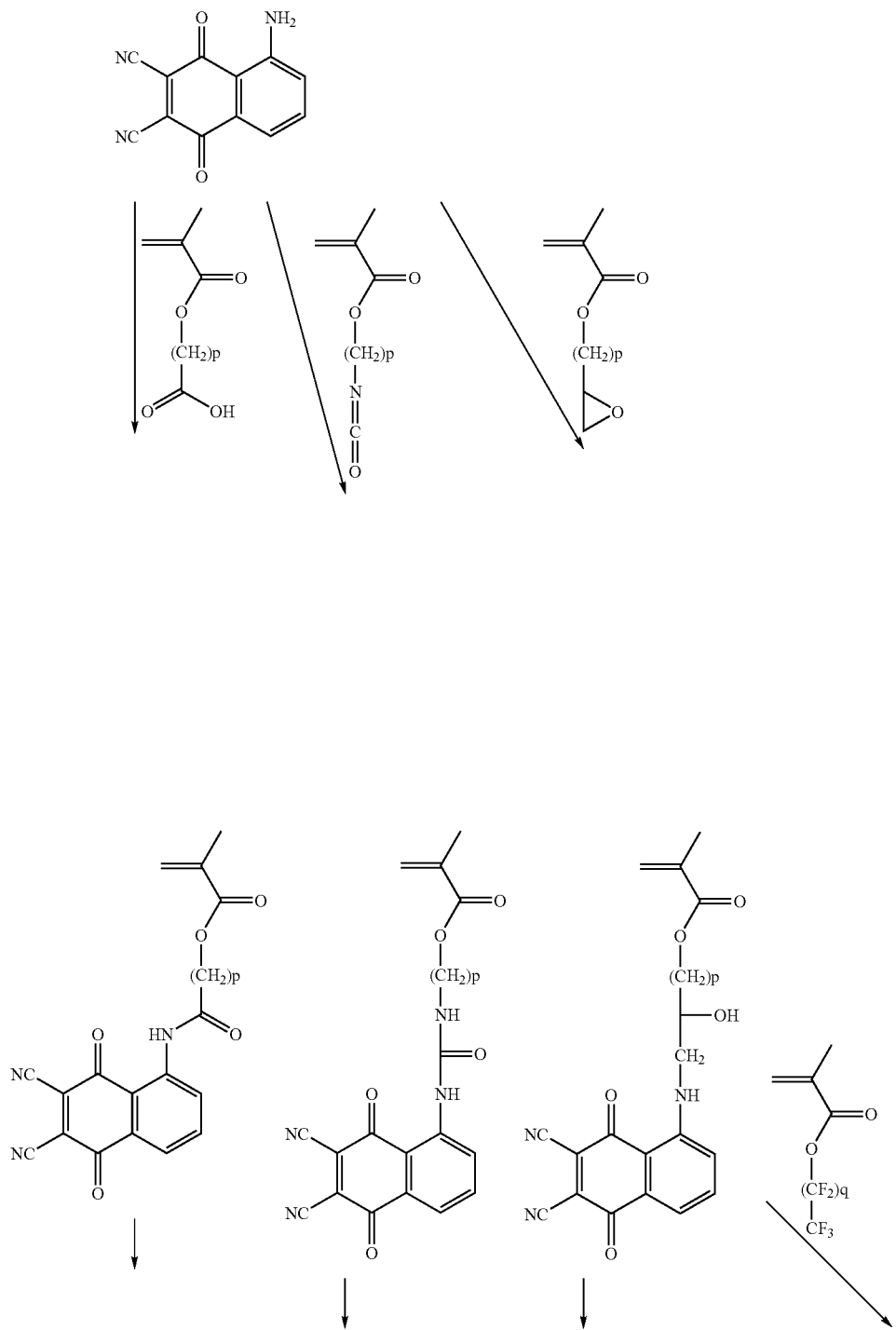

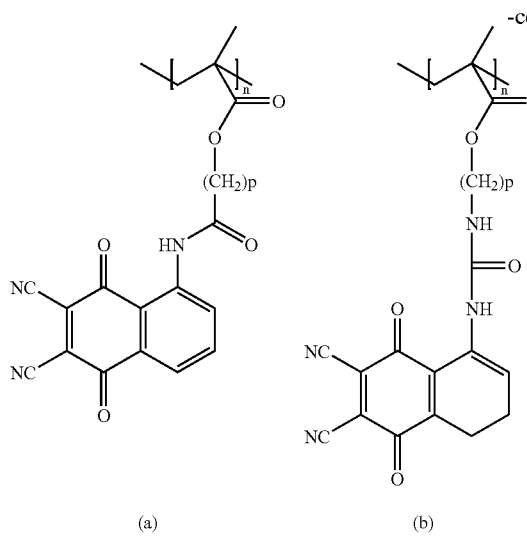

(a)     (b)     (c)     (d)

Another approach, as shown in Scheme 2 below, is to reduce the initial quinone to the hydroquinone, which has a more nucleophilic amine. Following the same synthetic steps incorporates the hydroquinone into the polymer. The polymer bound hydroquinone can be oxidised to the active quinone by reaction with a powerful oxidising agent, such as DDQ.

Scheme 2:

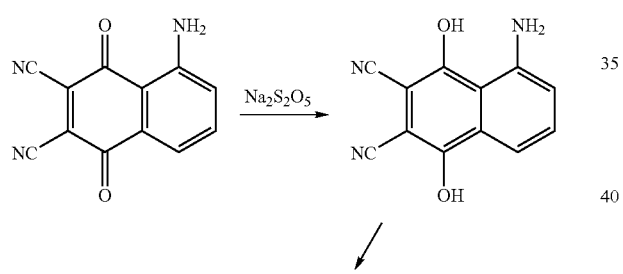

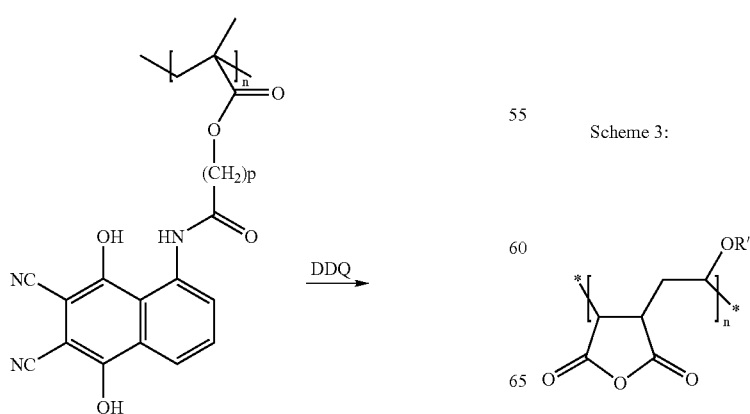

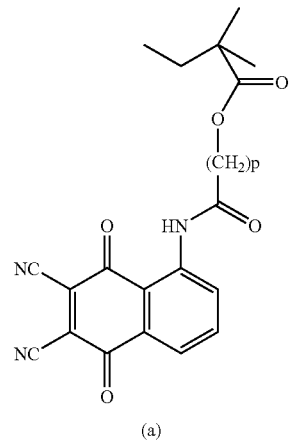

(a)

An example of a synthetic route via polymer-analoguous reaction to a non-surfactant type polymer dopant (e) based on polymethylene maleimide is shown in Scheme 3. Scheme 3:

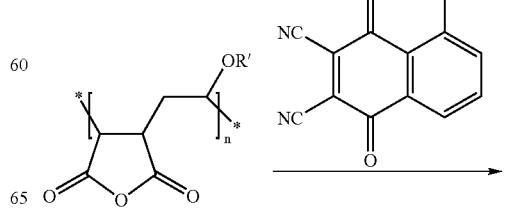

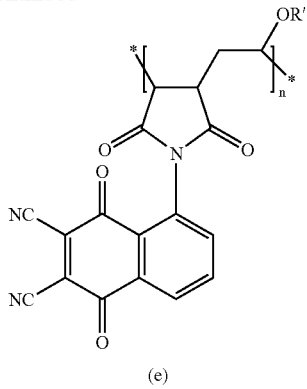

(e)

wherein R' is alkyl or alkoxy with 1 to 20 C atoms.

Preferably polymerization is carried out as in-situ polymerization of a coated layer of a monomer of formula I1, or of a mixture comprising two or more monomers of formula I1 and optionally formula I2, for example in bulk or dissolved in a suitable solvent, preferably during fabrication of the electronic or optical device comprising the inventive semiconductor material.

Polymerization can be initiated by exposing the monomers to heat or actinic radiation. Actinic radiation means irradiation with light, like UV light, IR light or visible light, irradiation with X-rays or gamma rays or irradiation with high energy particles, such as ions or electrons. Preferably polymerization is carried out by UV irradiation at a non-absorbing wavelength. As a source for actinic radiation for example a single UV lamp or a set of UV lamps can be used. When using a high lamp power the curing time can be reduced. Another possible source for actinic radiation is a laser, like e.g. a UV laser, an IR laser or a visible laser.

Polymerization is preferably carried out in the presence of an initiator absorbing at the wavelength of the actinic radiation. For example, when polymerizing by means of UV light, a photoinitiator can be used that decomposes under UV irradiation to produce free radicals or ions that start the polymerization reaction. When curing polymerizable materials with acrylate or methacrylate groups, preferably a radical photoinitiator is used, when curing polymerizable materials with vinyl, epoxide and oxetane groups, preferably a cationic photoinitiator is used. It is also possible to use a polymerization initiator that decomposes when heated to produce free radicals or ions that start the polymerization. As a photoinitiator for radical polymerization for example the commercially available Irgacure 651, Irgacure 184, Darocure 1173 or Darocure 4205 (all from Ciba Geigy AG) can be used, whereas in case of cationic photopolymerization the commercially available UVI 6974 (Union Carbide) can be used.

The polymerizable material can additionally comprise one or more other suitable components such as, for example, catalysts, sensitizers, stabilizers, inhibitors, chain-transfer agents, co-reacting monomers, surface-active compounds, lubricating agents, wetting agents, dispersing agents, hydrophobing agents, adhesive agents, flow improvers, defoaming agents, deaerators, diluents, reactive diluents, auxiliaries, colourants, dyes or pigments.

Creating a thin layer of a polymer dopant on a semiconductor surface can be achieved in different ways.

In a first preferred embodiment of the present invention, the polymer dopant, or a solution of the polymer dopant, is dispensed directly on the semiconductor layer, and the solvent, if present, is evaporated to form a thin layer.

By using this method it is possible to form an organic multilayer comprising at least one layer of an organic semiconductor material, and further comprising at least one layer of a polymer dopant according to the invention as described above, preferably selected of formula I or its preferred subformulae, which is in direct contact with said semiconductor layer. Such a multilayer is another object of the present invention.

In a second preferred embodiment of the present invention, a formulation containing one or more semiconducting polymers and one or more dopant polymers is prepared, preferably dissolved in a suitable solvent, in which the dopant polymer is designed to exhibit a lower surface energy than the semiconducting polymer. On dispensing this formulation to form a film, the dopant polymer, behaving like a surfactant, is driven by thermodynamics to the surface.

This method is especially advantageous as it allows the formation of a monolithic layer, and avoids the extra processing steps for preparing the semiconductor layer and the doping layer. To ensure the low surface energy, the dopant polymer should preferably contain a doping component and a low energy component, like for example a fluorinated or siloxane functionality. An example for such a polymer is a copolymer of formula I wherein n is >0, and wherein G represents the doping component and R the low energy component.

By using this method it is possible to form an organic material with improved charge carrier mobility comprising one or more organic semiconducting components and one or more polymer dopant components, wherein at least one polymer dopant component is a polymer according to the present invention as described above and below, preferably a copolymer contain a doping component and a low energy component, very preferably selected of formula I or its preferred subformulae.

Such an organic material is another object of the present invention. Especially preferred is an organic material wherein the semiconductor and polymer dopant components form a mixture, solution, dispersion or polymer blend, optionally with further components.

Another object of the invention is a monolithic film or layer of an organic material with improved charge carrier mobility, comprising one or more organic semiconducting components and one or more polymer dopant components as described above, wherein the polymer dopant components are predominantly situated at the surfaces of the film or layer.

Another object of the invention is a semiconductor, electrical conductor, photoconductor, electrooptical or electronic material, component or device, comprising such an organic material or film.

Films can be formed from solution by well known techniques such as spin coating, dip coating, spray coating, doctor blading as well as printing techniques including all types of gravure coating, ink jetting, stamping and screen printing.

All common organic semiconducting materials are suitable candidates as the semiconducting host, including, but not limited to, polyalkylthiophenes, polythiophenes, polyfluorenes, polyphenylamines, and their copolymers, as well as small molecules such as pentacene, other polyacenes, and other fused ring compounds.

The combination of a semiconducting and a polymer dopant material according to the present invention can be used as an organic "metal" in applications, for example, but not limited to, charge injection layers and ITO planarising layers in organic light emitting diode applications, films for flat panel displays and touch screens, antistatic films, printed conductive substrates, patterns or tracts in electronic applications such as printed circuit boards and condensers.

Furthermore, the polymer dopants of the present invention are useful as dopants for optical, electronic and semiconductor materials, in particular for charge transport materials in field effect transistors (FETs), for photovoltaics or sensor materials, for electrophotographic recording materials, and for other semiconductor applications. Such FETs, where an organic semiconductive material is arranged as a film between a gate-dielectric and a drain and a source electrode, are generally known, e.g., from U.S. Pat. No. 5,892,244, WO 00/79617, U.S. Pat. No. 5,998,804, and from the references cited in the background and prior art chapter and listed below. Due to the advantages, like low cost production using the solubility properties of the compounds according to the invention and thus the processibility of large surfaces, preferred applications of these FETs are such as integrated circuitry, TFT-displays and security applications.

In security applications, field effect transistors and other devices with semiconductive materials, like transistors or diodes, may be used for ID tags or security markings to authenticate and prevent counterfeiting of documents of value like banknotes, credit cards or ID cards, national ID documents, licenses or any product with money value, like stamps, tickets, shares, cheques etc.

Alternatively, the polymers according to the invention may be used as dopants in organic light emitting devices or diodes (OLEDs), e.g., in display applications or as backlight of e.g. liquid crystal displays. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive materials may be employed in one or more of the charge transport layers and/or in the emission layer, corresponding to their electrical and/or optical properties. The selection, characterization as well as the processing of suitable monomeric, oligomeric and polymeric compounds or materials for the use in OLEDs is generally known by a person skilled in the art, see, e.g., Meerholz, Synthetic Materials, 111-112, 2000, 31-34, Alcala, J. Appl. Phys., 88, 2000, 7124-7128 and the literature cited therein.

The entire disclosures of all applications, patents and publications, cited herein and of corresponding European application No. 03001678.6, filed Jan. 25, 2003 are incorporated by reference herein.

The preceding examples can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

The invention claimed is:

1. A semiconductor comprising a semiconductor matrix and a polymer dopant comprising at least one electron accepting group that is bound to a polymer, wherein the charge carrier mobility or electrical conductivity of said polymer is induced or enhanced, wherein said polymer contains recurring units of formula I

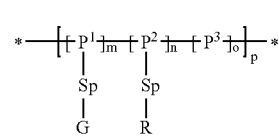

wherein $P^{1-3}$ are, independently of each other, a group forming a polymer backbone, Sp is, each independently, a spacer group or a single bond, G is an electron accepting group, R is an organic group that modifies the surface energy of the polymer, m, n, o are, independently of each other, 0 or 1, wherein in each recurring unit of formula I m+n+o>0, and in at least one of these recurring units m is 1, and p is an integer from 1 to 500,000, wherein the electron accepting group is of formula

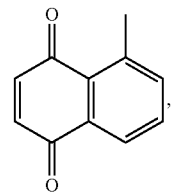

IIIa

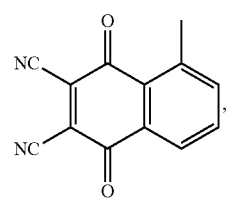

IIIb

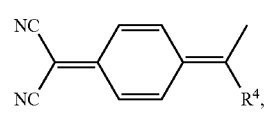

IVa

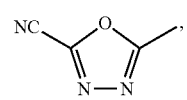

Va

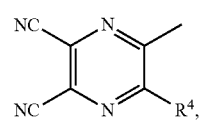

VIa

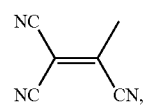

VIIa

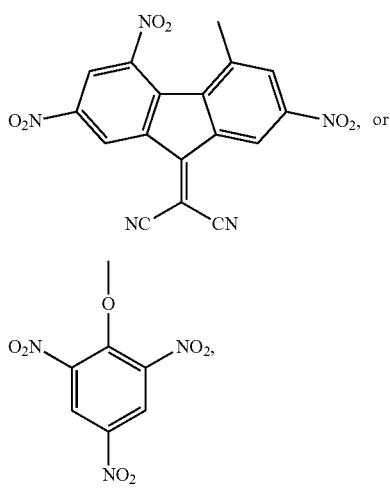

wherein R⁴ is H, halogen, CN, NO₂, NR⁰R⁰⁰, or straight chain, branched or cyclic alkyl with 1 to 20 C-atoms, which is unsubstituted, mono- or polysubstituted by F, Cl, Br, I or CN, and wherein one or more non-adjacent CH₂ groups are optionally replaced, in each case independently from one another, by —O—, —S—, —NH—, —NR⁰—, —SiR⁰R⁰⁰—, —CO—, —COO—, —OCO—, —OCO—O—, —SO₂—, —S—CO—, —CO—S—, —CH=CH— or —C≡C— in such a manner that O and/or S atoms are not linked directly to one another.

2. A semiconductor according to claim 1, wherein the electron accepting group is covalently incorporated in a polymer main chain or covalently bound, optionally via a spacer group, as a side group or part of a side chain, to a polymer backbone.

3. A semiconductor according to claim 2, wherein the polymer backbone comprises maleic anhydride (co-)polymer, maleimide (co-) polymer, polyacrylpolyacrylate, polymethacrylate, poly-α-haloacrylate, poly-α-cyanoacrylate, polyacrylamide, polyacrylonitrile, polymethylene malonate, polymethylene maleimide, polyester, polyimide, polyimide, polyphosphazene, polyurethane, polysiloxane, polyepoxide, polyvinylalcohol, polyvinylether, polyvinlpyrrolidone, polyethyleneimine, polyalkylene, polycarbonate, or polystyrene or copolymers thereof.

4. A semiconductor according to claim 1, wherein p is an integer of 10 to 500,000.

5. A semiconductor according to claim 1, wherein R is $C_1$-$C_{20}$-fluoroalkyl, $C_1$-$C_{15}$-perfluoroalkyl, —(Si(R⁰R⁰⁰)—O)_r—R⁰⁰⁰ or (CH₂CH₂O)_s, wherein R⁰, R⁰⁰ and R⁰⁰⁰ are, independently of each other, H or alkyl with 1 to 12 C-atoms, r is an integer from 1 to 15, and s is an integer from 1 to 6.

6. A semiconductor according to claim 1, wherein the spacer group is of formula II X¹-Sp¹-X²  II wherein Sp¹ is a single bond or an alkylene with 1 to 20 C atoms which is unsubstituted, mono- or poly-substituted by F, Cl, Br, I, CN or OH, in which optionally one or more non-adjacent CH₂ groups are replaced, in each case independently from one another, by —O—, —S—, —NH—, —NR⁰—, —SiR⁰R⁰⁰—, CO—, —COO—, —OCO—, —OCO—, —S—CO—, —CO—S—, —CH=CH— or —C≡C— in such a manner that O and/or S atoms are not linked directly to one another, X¹ and X² are, independently of each other, —O—, —S—, —NR⁰—, —CO—, —COO—, —OCO—, —O—COO—, —CO—NR⁰—, —NR⁰—CO—, —OCH₂—, —CH₂O—, —SCH₂—, —CH₂S—, —CF₂O—, —OCF₂—, —CF₂S—, —SCF₂—, —CF₂CH₂—, —CH₂CF₂—, —CF₂CF₂—, —CH=N—, —N=CH—, —CH=CH—, —CR⁰=CR⁰⁰—, —CY¹=CY²—, —C≡C—, —CH=CH—COO—, —OCO—CH=CH— or a single bond, Y¹ and Y² are, independently of each other, H, F, Cl or CN, and R⁰ and R⁰⁰ are, independently of each other, H or alkyl with 1 to 12 C-atoms.

7. A semiconductor according to claim 6, wherein the spacer group is of formula,

| | |
|---|---|
| *-Alkyl-CO—NH— | IIa, |
| *-Alkyl-COO— | IIb, |
| *-Alkyl-O— | IIc, |
| *-Alkyl-NH— | IId, |
| *-Alkyl- | IIe, |
| *-Alkyl-CH(OH)—CH₂—NH— | IIf, or |
| *-Alkyl-CH(OH)—CH(OH)—CH₂—O— | IIg, | wherein Alkyl denotes an alkyl, fluoroalkyl or oxaalkyl group with 1 to 15 C atoms, and the asterisk denotes the side that is linked to the polymer backbone.

8. A semiconductor according to claim 1, wherein the electron accepting group is of formula III

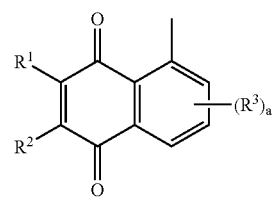

wherein

R¹ and R² are, independently of each other, H, halogen or CN,

R³ is, in each occurrence independently of one another, H, halogen, CN, NO₂, NR⁰R⁰⁰, or straight chain, branched or cyclic alkyl with 1 to 20 C-atoms, which is unsubstituted, mono- or polysubstituted by F, Cl, Br, I or CN, and wherein one or more non-adjacent CH₂ groups are optionally replaced, in each case independently from one another, by —O—, —S—, —NH—, —NR⁰—, —SiR⁰R⁰⁰—, —CO—, —COO—, —OCO—, —OCO—O—, —SO₂—, —S—CO—, —CO—S—, —CH=CH— or —C≡C— in such a manner that O and/or S atoms are not linked directly to one another, R⁰ and R⁰⁰ are, independently of each other, H or alkyl with 1 to 12 carbon atoms, and a is 0, 1, 2 or 3.

9. A semiconductor according to claim 1, wherein the electron accepting group is of formula

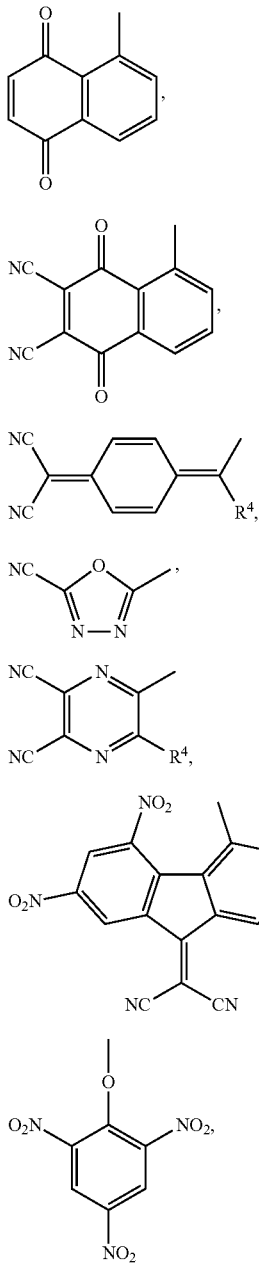

IIIa

IIIb

IVa

Va

VIa

VIIIa

IXa wherein $R^4$ is H, halogen, CN, $NO_2$, $NR^0R^{00}$, or straight chain, branched or cyclic alkyl with 1 to 20 C-atoms, which is unsubstituted, mono- or polysubstituted by F, Cl, Br, I or CN, and wherein one or more non-adjacent $CH_2$ groups are optionally replaced, in each case independently from one another, by —O—, —S—, —NH—, —$NR^0$—, —$SiR^0R^{00}$—, —CO—, —COO—, —OCO—, —OCO—O—, —$SO_2$—, —S—CO—, —CO—S—, —CH=CH— or —C≡C— in such a manner that O and/or S atoms are not linked directly to one another.

10. A semiconductor according to claim 1, wherein the polymer further comprises at least one organic group that modifies the surface energy to the polymer, said organic group being covalently bound, optionally via a spacer group, to the polymer backbone.

11. A semiconductor according to claim 10, wherein the organic group lowers the surface energy of the polymer.

12. A semiconductor according to claim 1 wherein R is an organic group that lowers the surface energy of the polymer.

13. A method of inducing or enhancing the charge carrier mobility or electrical conductivity of a polymer dopant in a semiconductor according to claim 1 comprising binding at least one electron accepting group to the polymer.

14. A method according to claim 13, wherein the electron accepting group is covalently incorporated in a polymer main chain or covalently bound, optionally via a spacer group, as a side group or part of a side chain, to a polymer backbone.

15. A method according to claim 13, wherein the polymer dopant is a polymer containing recurring units of formula I

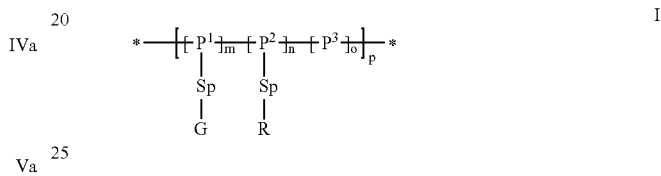

I wherein
$P^{1-3}$ are, independently of each other, a group forming a polymer backbone,
Sp a spacer group,
G is an electron accepting group,
R is an organic group that modifies the surface energy of the polymer,
m, n, o are, independently of each other, 0 or 1, wherein in each recurring unit of formula I m+n+o>0, and in at least one of these recurring units m is 1, and
p is an integer from 1 to 500,000.

16. A semiconductor or a charge transport component comprising a semiconductor matrix and a polymer dopant comprising at least one electron accepting group that is bound to a polymer, wherein the charge carrier mobility or electrical conductivity of said polymer is induced or enhanced, wherein said polymer contains recurring units of formula I

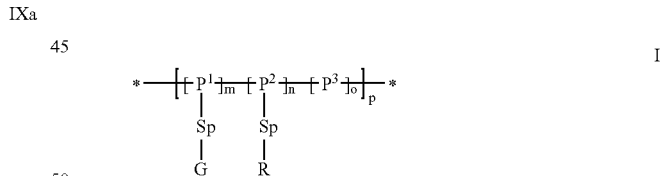

I wherein
$P^{1-3}$ are, independently of each other, a group forming a polymer backbone,
Sp is, each independently, a spacer group or a single bond,
G is an electron accepting group,
R is an organic group that modifies the surface energy of the polymer,
m, n, o are, independently of each other, 0 or 1, wherein in each recurring unit of formula I m+a+o>0, and in at least one of these recurring units m is 1, and
p is an integer from 1 to 500,000,
and
wherein the spacer group is of formula,

*-Alkyl-CO—NH—   IIa,

*-Alkyl-COO—   IIb,

| *-Alkyl-O— | IIc, |
| *-Alkyl-NH— | IId, |
| *-Alkyl- | IIe, |
| *-Alkyl-CH(OH)—CH₂—NH— | IIf, or |
| *-Alkyl-CH(OH)—CH₂—O— | IIg, | wherein Alkyl denotes an alkyl, fluoroalkyl or oxaalkyl group with 1 to 15 C atoms, and the asterisk denotes the side that is linked to the polymer backbone,
and
wherein the electron accepting group is of formula III

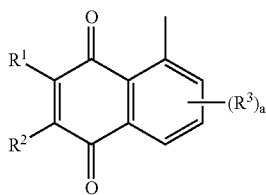

wherein
$R^1$ and $R^2$ are, independently of each other, H, halogen or CN,
$R^3$ is, in each occurrence independently of one another, halogen, CN, $NO_2$, $NR^OR^{OO}$, or straight chain, branched or cyclic alkyl with 1 to 20 C-atoms, which is unsubstituted, mono- or polysubstituted by F, Cl, Br, I or CN, and wherein one or more non-adjacent $CH_2$ groups are optionally replaced, in each case independently from one another, by —O—, —S—, —NH—, —$NR^O$—, —$SiR^OR^{OO}$—, —CO—, —COO—, —OCO—, —OCO—O—, —$SO_2$—, —S—CO—, —CO—S—, —CH=CH— or —C≡C— in such a manner that O and/or S atoms are not linked directly to one another, $R^O$ and $R^{OO}$ are, independently of each other, H or alkyl with 1 to 12 carbon atoms, and
a is 1, 2 or 3.

17. A semiconductor or a charge transport component comprising a semiconductor matrix and a polymer dopant comprising at least one electron accepting group that is bound to a polymer, wherein the charge carrier mobility or electrical conductivity of said polymer is induced or enhanced,
wherein said polymer contains recurring units of formula I

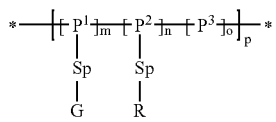

wherein
$P^{1-3}$ are, independently of each other, a group forming a polymer backbone,
Sp is, each independently, a spacer group or a single bond,
G is an electron accepting group,
R is an organic group that modifies the surface energy of the polymer,
m, n, o are, independently of each other, 0 or 1, wherein in each recurring unit of formula I m+n+o>0, and in at least one of these recurring units m is 1, and
p is an integer from 1 to 500,000,
and
wherein the spacer group is of formula,

| *-Alkyl-CO—NH— | IIa, |
| *-Alkyl-COO— | IIb, |
| *-Alkyl-O— | IIc, |
| *-Alkyl-NH— | IId, |
| *-Alkyl- | IIe, |
| *-Alkyl-CH(OH)—CH₂—NH— | IIf, or |
| *-Alkyl-CH(OH)—CH(OH)—CH₂—O— | IIg, | wherein Alkyl denotes an alkyl, fluoroalkyl or oxaalkyl group with 1 to 15 C atoms, and the asterisk denotes the side that is linked to the polymer backbone,
and
wherein the electron accepting group is of formula III

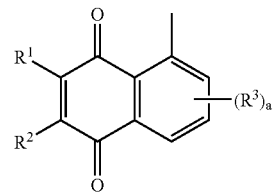

wherein
$R^1$ and $R^2$ are halogen,
$R^3$ is, in each occurrence independently of one another, H, halogen, CN, $NO_2$, $NR^OR^{OO}$, or straight chain, branched or cyclic alkyl with 1 to 20 C-atoms, which is unsubstituted, mono- or polysubstituted by F, Cl, Br, I or CN, and wherein one or more non-adjacent $CH_2$ groups are optionally replaced, in each case independently from one another, by —O—, —S—, —NH—, —$NR^O$—, —$SiR^OR^{OO}$—, —CO—, —COO—, —OCO—, —OCO—O—, —$SO_2$—, —S—CO—, —CO—S—, —CH=CH— or —C≡C— in such a manner that O and/or S atoms are not linked directly to one another,
$R^O$ and $R^{OO}$ are, independently of each other, H or alkyl with 1 to 12 carbon atoms, and
a is 0, 1, 2 or 3.

* * * * *

UNITED STATES PATENT AND TRADEMARK OFFICE
CERTIFICATE OF CORRECTION

PATENT NO. : 8,562,870 B2  
APPLICATION NO. : 11/503933  
DATED : October 22, 2013  
INVENTOR(S) : Iain McCulloch et al.

Page 1 of 1

It is certified that error appears in the above-identified patent and that said Letters Patent is hereby corrected as shown below:

IN THE CLAIMS:

Column 19, line 42 (Claim 3), reads: -- polymethylene maleimide, polyester, polyimide, polyimide, --.  
Should read as follows: -- polymethylene maleimide, polyester, polyamide, polyimide, --.

Column 20, line 7 (Claim 6), reads: -- -CH=N-, -N=CH-. –CH=CH-, --.  
Should read as follows: -- -CH=N-, -N=CH-. –N=N-, –CH=CH-, --.

Column 24, line 51 (Claim 17), reads: -- -NR$^0$-, -$^{SiR0}$R$^{00}$-, -CO-, -COO-, -OCO-, --.  
Should read as follows: -- -NR$^0$-, -SiR$^0$R$^{00}$-, -CO-, -COO-, -OCO-, --.

Signed and Sealed this  
Eleventh Day of February, 2014

Michelle K. Lee  
*Deputy Director of the United States Patent and Trademark Office*